United States Patent
Singer et al.

(10) Patent No.: US 7,473,907 B2
(45) Date of Patent: Jan. 6, 2009

(54) ILLUMINATION SYSTEM FOR A WAVELENGTH OF ≦ 193 NM, WITH SENSORS FOR DETERMINING AN ILLUMINATION

(75) Inventors: Wolfgang Singer, Aalen (DE); Martin Antoni, Aalen (DE); Johannes Wangler, Königsbronn (DE); Markus Weiss, Aalen (DE); Vadim Yevgenyevich Banine, Helmond (NL); Marcel Dierichs, Venlo (NL); Roel Moors, Helmond (NL); Karl Heinz Schuster, Königsbronn (DE); Axel Scholz, Aalen (DE); Philipp Bosselmann, Schwaebisch Gmuend (DE); Bernd Warm, Schwaig (DE)

(73) Assignees: Carl Zeiss SMT AG, Oberkochen (DE); ASML Netherlands, Weldhoven (NL)

( * ) Notice: Subject to any disclaimer, the term of this patent is extended or adjusted under 35 U.S.C. 154(b) by 434 days.

(21) Appl. No.: 11/091,238

(22) Filed: Mar. 28, 2005

(65) Prior Publication Data

US 2005/0274897 A1   Dec. 15, 2005

Related U.S. Application Data

(63) Continuation-in-part of application No. PCT/EP03/10605, filed on Sep. 24, 2003.

(30) Foreign Application Priority Data

Sep. 30, 2002   (DE) .................... 102 45 625
Aug. 14, 2003   (DE) .................... 103 37 766

(51) Int. Cl.
*G01G 1/00*    (2006.01)
*G01J 1/42*    (2006.01)

(52) U.S. Cl. .................. 250/492.2; 250/504 R; 250/372; 250/494.1; 378/85

(58) Field of Classification Search ... 250/492.1–504 H
See application file for complete search history.

(56) References Cited

U.S. PATENT DOCUMENTS 4,490,041 A   12/1984   Riemer ................. 356/334
5,731,577 A    3/1998   Tanitsu ................ 250/201.5

(Continued)

FOREIGN PATENT DOCUMENTS

EP       0 421 746 A2    4/1991

(Continued)

OTHER PUBLICATIONS

International Search Report dated Jul. 5, 2004 corresponding to PCT/EP03/10605.

(Continued)

*Primary Examiner*—Jack I. Berman
*Assistant Examiner*—Andrew Smyth
(74) *Attorney, Agent, or Firm*—Ohlandt, Greeley, Ruggiero & Perle, L.L.P.

(57) ABSTRACT

There is provided an illumination system that includes (a) a light source that emits light having a wavelength ≦193 nm, where the light provides a predetermined illumination in a plane distant from the light source and defines a used area in the plane, and (b) a sensor, situated in or near the plane, for detecting light outside the used area.

29 Claims, 11 Drawing Sheets

U.S. PATENT DOCUMENTS

| | | | |
|---|---|---|---|
| 6,081,581 A | 6/2000 | Hasegawa | 378/145 |
| 6,353,470 B1 | 3/2002 | Dinger | 355/71 |
| 6,438,199 B1 | 8/2002 | Schultz et al. | 378/34 |
| 6,727,980 B2 * | 4/2004 | Ota et al. | 355/55 |
| 6,825,481 B2 | 11/2004 | Miyake | 250/492.2 |
| 6,999,620 B1 * | 2/2006 | Harville | 382/173 |
| 7,193,685 B2 * | 3/2007 | Miura | 355/55 |
| 7,217,940 B2 | 5/2007 | Partlo et al. | 250/504 |
| 2002/0186811 A1 | 12/2002 | Weiss et al. | 378/34 |
| 2003/0038225 A1* | 2/2003 | Mulder et al. | 250/205 |
| 2003/0146391 A1* | 8/2003 | Kleinschmidt et al. | 250/372 |

FOREIGN PATENT DOCUMENTS

| | | | |
|---|---|---|---|
| EP | 0 987 601 A2 | | 3/2000 |
| EP | 0987601 | * | 3/2000 |
| JP | 08-279447 | * | 10/1996 |
| JP | 08 279447 A | | 10/1996 |
| WO | WO 02/065482 A2 | | 8/2002 |

OTHER PUBLICATIONS

M. Antoni, W. Singer, J. Schultz, J. Wangler, I. Escudero-Sanz, B. Kruizinga, "Illumination Optics Design for EUV-Lithography" in Soft Xray and EUV Imaging Systems, WM Kaiser, RH Stulen (Eds.) Proceedings for SPIE, vol. 4146 (2000) pp. 25-34.

W. Ulrich, S. Beiersdorfer, H.J. Mann, "Trends in Optical Design of Projection Lenses for UV- and EUV Lithography" in Soft Xray and EUV Imaging Systems, WM Kaiser, RH Stulen (Eds.) Proceeding of SPIE, vol. 4146 (2000) pp. 13-24.

* cited by examiner

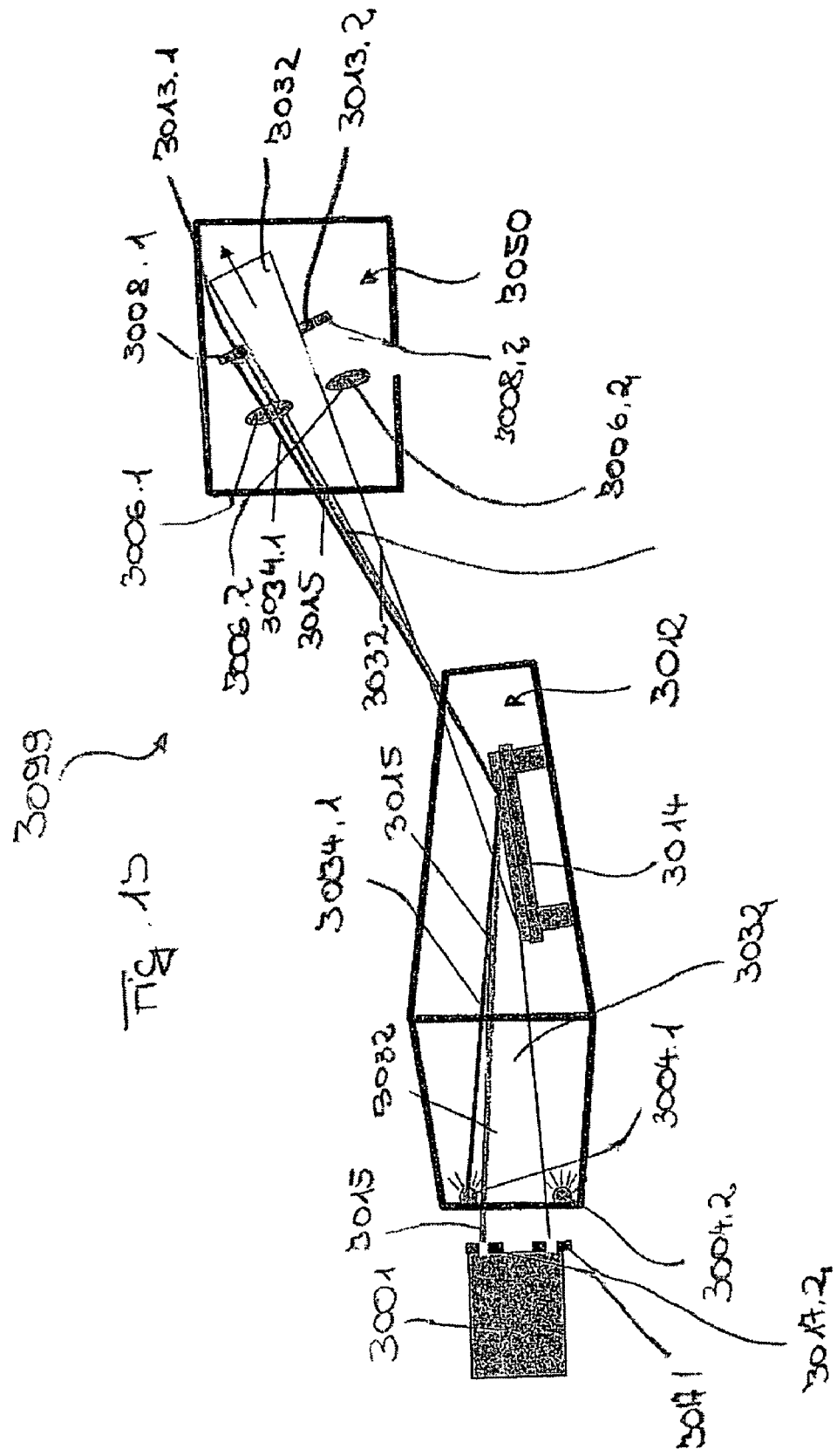

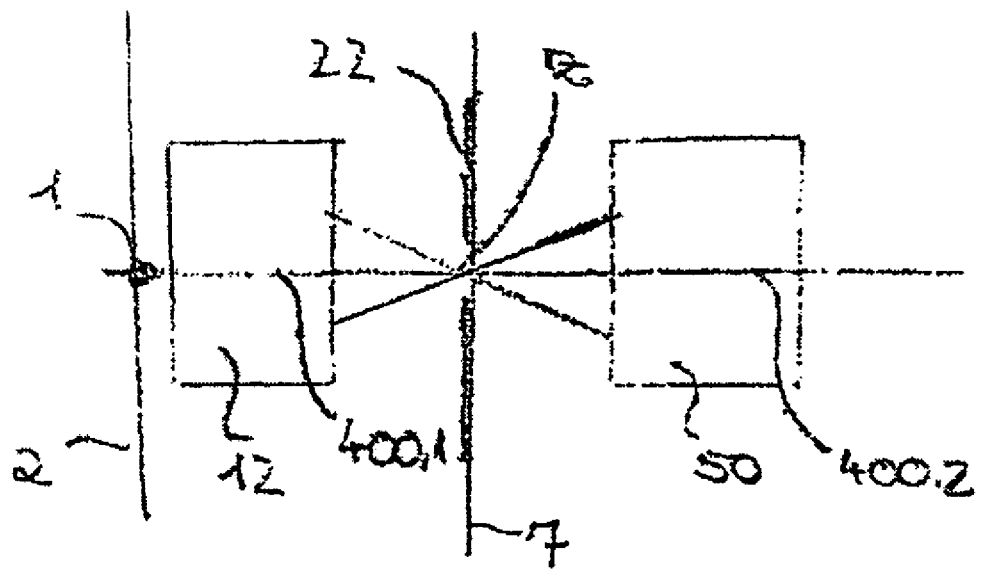
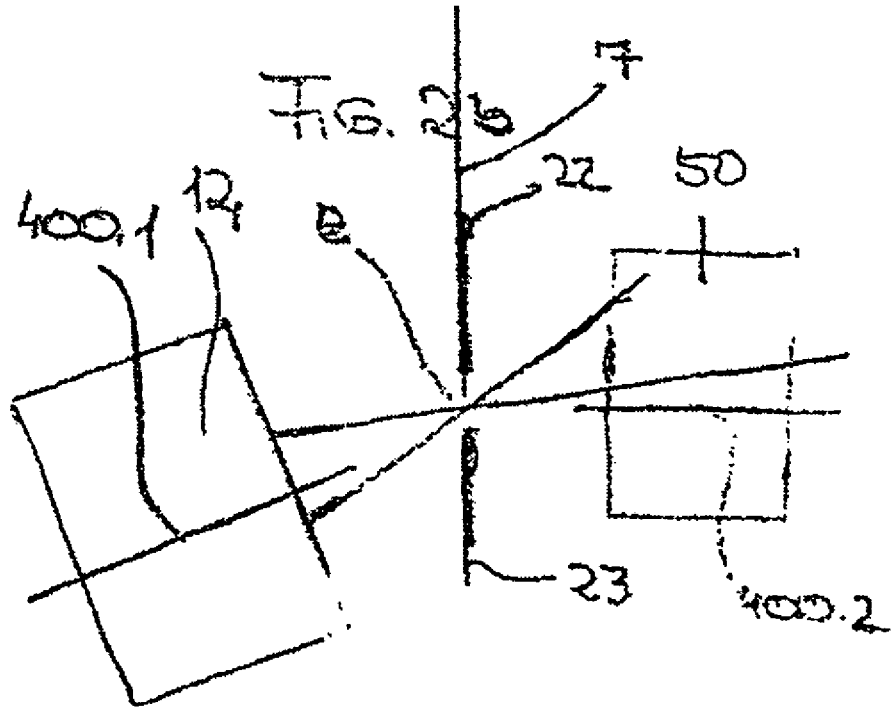

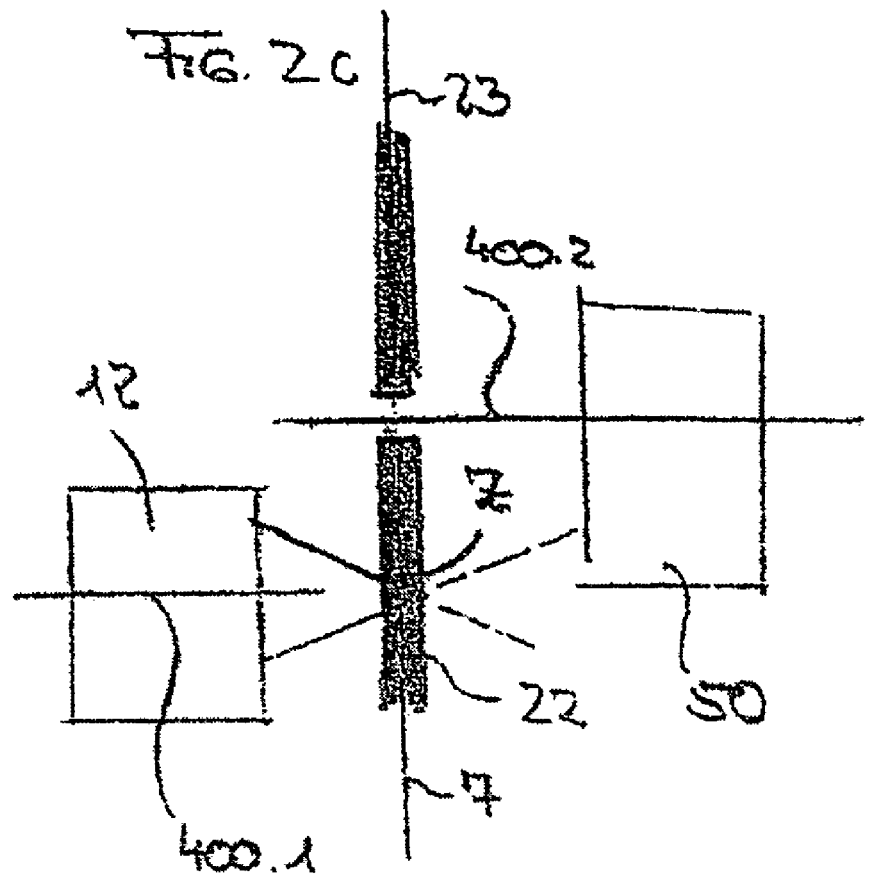
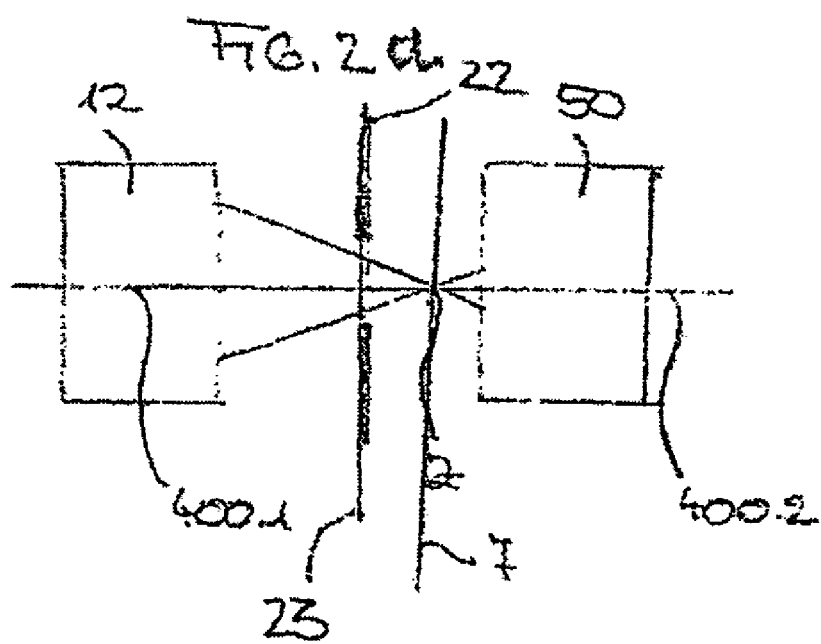

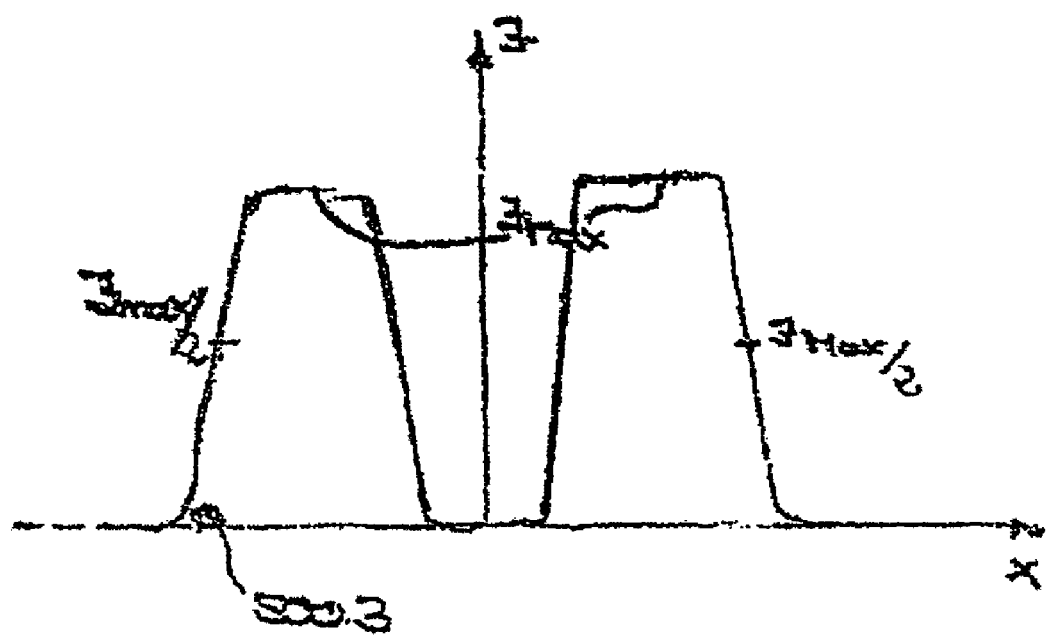

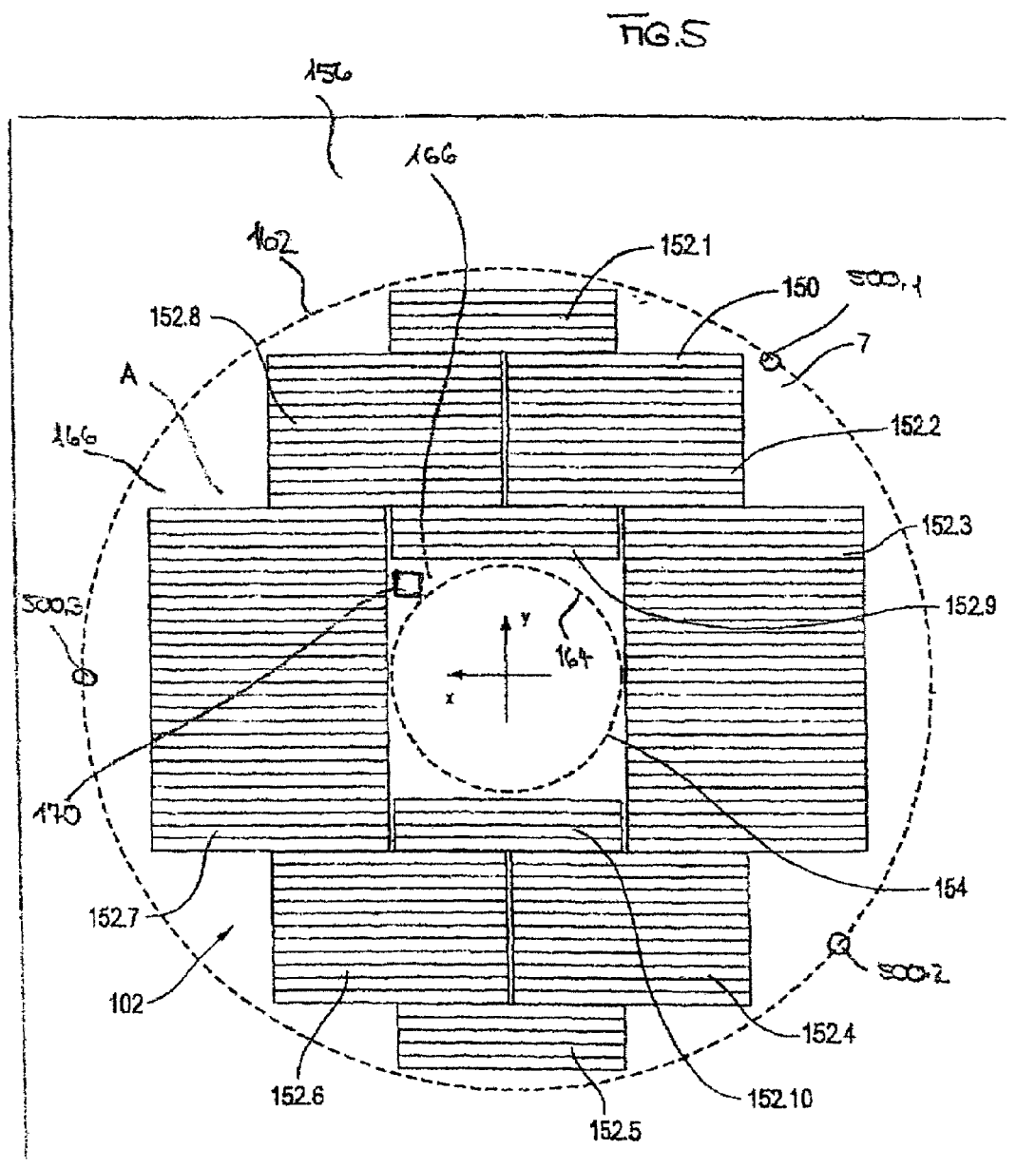

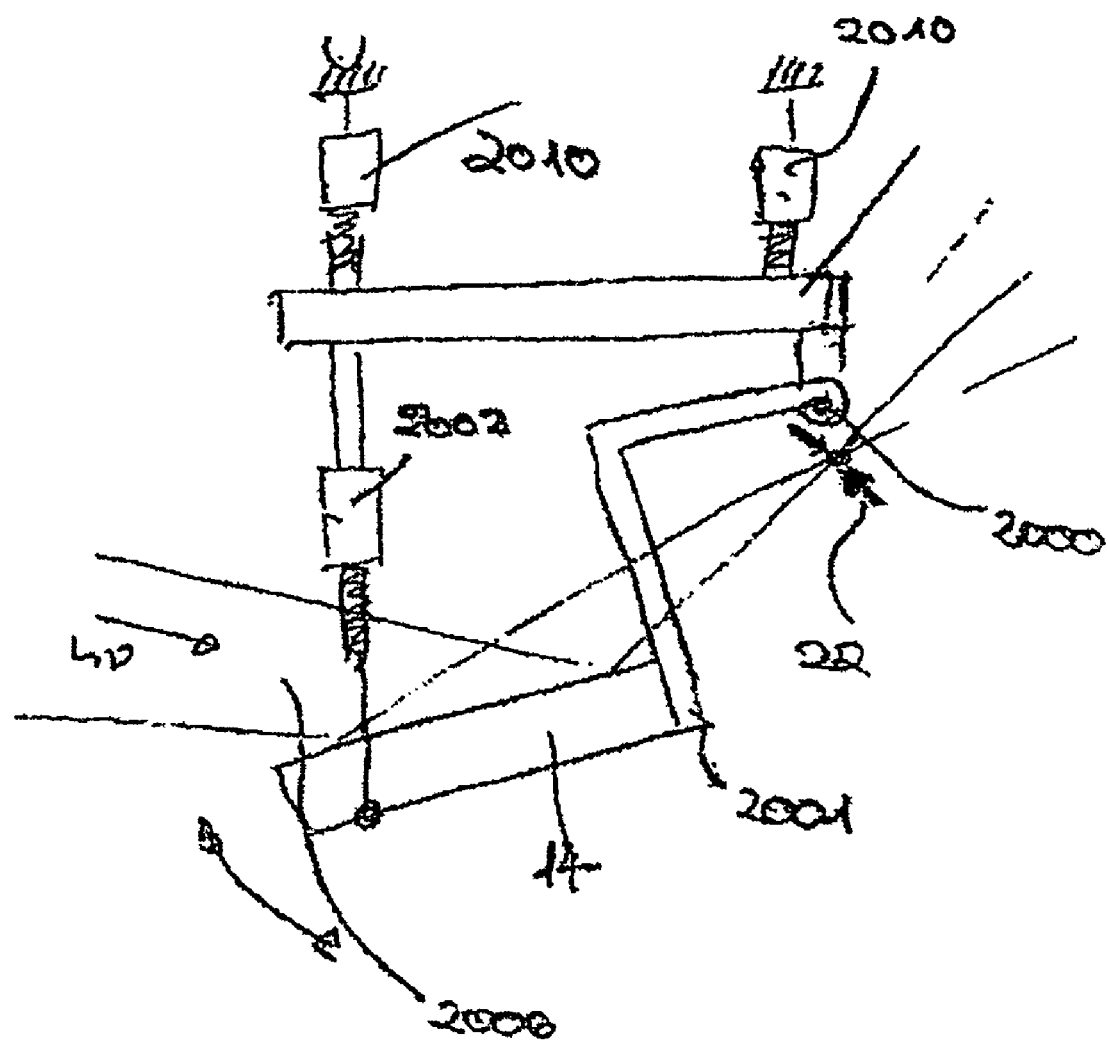

US 7,473,907 B2

ILLUMINATION SYSTEM FOR A WAVELENGTH OF ≦ 193 NM, WITH SENSORS FOR DETERMINING AN ILLUMINATION

CROSS-REFERENCE TO RELATED APPLICATIONS

The present application is a continuation-in-part of PCT/EP2003/10605, filed Sep. 24, 2003, the content of which is herein incorporated by reference.

BACKGROUND OF THE INVENTION

1. Field of the Invention

The invention concerns an illumination system for wavelengths of ≦193 nm with a light source that provides a predetermined illumination A in a plane. The illumination system comprises a first optical component with first raster elements, which are arranged on a support element, wherein the first optical component is disposed in, or in the vicinity of, the plane in which the illumination is provided. The wavelength preferably lies in the wavelength range of ≦100 nm, particularly in the wavelength range which can be used for EUV lithography, i.e., in the range of 11 to 14 nm, in particular, at 13.5 nm.

2. Description of the Related Art

In order to still further reduce the structural widths for electronic components, in particular, to the submicron range, it is necessary to reduce the wavelengths of the light utilized for microlithography. The use of light with wavelengths smaller than 100 nm is conceivable, for example, lithography with soft x-rays, so-called EUV lithography.

EUV lithography is one of the most promising future lithography techniques. At the present time, wavelengths in the range of 11-14 nm, in particular, 13.5 nm, are discussed as wavelengths for EUV lithography, with a numerical aperture of 0.2 -0.3. The image quality in EUV lithography is determined, on the one hand, by the projection objective, and, on the other hand, by the illumination system. The illumination system will provide an illumination that is as uniform as possible of the field plane, in which the pattern-bearing mask, the so-called reticle, is disposed. The projection objective images the field plane into an image plane, the so-called wafer plane, in which a light-sensitive object is disposed. Projection exposure systems for EUV lithography are designed with reflective optical elements. The shape of the field in the image plane of an EUV projection exposure system is typically that of an annular field with a high aspect ratio of 2 mm (width)× 22-26 mm (arc length). The projection systems are usually operated in scanning mode. With respect to EUV projection exposure systems, reference is made to the following publications:

W. Ulrich, S. Beiersdorfer, H. J. Mann, "Trends in Optical Design of Projection Lenses for UV- and EUV-Lithography" in Soft-X-Ray and EUV Imaging Systems, W. M. Kaiser, R. H. Stulen (Eds.), Proceedings of SPIE, Vol. 4146 (2000), pages 13-24 and

M. Antoni, W. Singer, J. Schultz, J. Wangler, I. Escudero-Sanz, B. Kruizinga, "Illumination Optics Design for EUV-Lithography" in Soft X Ray and EUV Imaging Systems, W. M. Kaiser, R. H. Stulen (Eds.), Proceedings of SPIE, Vol. 4146 (2000), pages 25-34, the disclosure content of which is incorporated to the full extent in the present application.

In order to image a mask disposed in an image plane of the illumination system onto a light-sensitive substrate, for example, a wafer, which can be used for the production of semiconductor components, it is necessary that the form of the illumination and the lighting intensity are kept constant in the image plane, in which the mask is disposed, during the exposure process. A change in the illumination can be caused both by the power as well as by position due to a degradation of the source or a change in the position of the source.

In particular, in illumination systems that consist of two subsystems, a first subsystem, which comprises a light source and first optical elements that image the light source, for example, into a real intermediate image, and a second subsystem, which comprises second optical elements in order to illuminate a field in a field plane, for example, by means of a change in the radiating characteristic of the source, the position of the source or even a decentering or misalignment of the first and second subsystems, the illumination of a field can fluctuate in a field plane, or a loss of uniformity in the field plane as well as telecentricity error in the field plane can arise.

In EP 0 987,601 A2, a projection exposure system is described, which comprises a device, with which the intensity of an illumination, the so-called exposure dose, can be determined. In addition, an illumination system is indicated in EP 0 987,601 A2, which has a first subsystem, comprising a light source and first optical elements, wherein the first subsystem images the light source into an intermediate image. In addition, the illumination system comprises a second subsystem, which is disposed downstream from the intermediate image of the light source in the light path from the light source to the field plane, whereby the second subsystem comprises second optical elements for illuminating a field in a field plane.

In addition, in EP 0 987,601 A2, it is generally described that, for aligning the first and second subsystems, the illumination device comprises a detection device, with which positional deviations of the optical axis between the first subsystem, the so-called source system, and the second subsystem are detected. For this purpose, EP 0 987,601 A2 in general proposes to arrange sensors on a facet mirror disposed in the second subsystem. In order to be able to align the optical axis as a function of the detected deviation, it is described in EP 0 987,601 A2 to design the collector mirror in a positionable manner, so that it is possible to correct a misalignment of the first and second subsystems by adjusting the collector mirror.

It is a disadvantage in the system according to EP 0 987,601 that a misalignment or decentering of the optical axis of the illumination system is detected by means of the change in the photoelectric effect, which occurs on one or both facetted optical elements of the illumination system. The change in the photoelectric effect is caused by all raster elements or facets of the facetted elements. This determination is very complicated.

A further disadvantage of the system described in EP 0 987,601 is that an insufficiently precise detection of the illumination is achieved in the field plane. Essentially only a decentering of the optical axis is detected in an illumination system consisting of two subsystems, wherein the first subsystem represents a source unit and the second subsystem comprises optical elements for illuminating a field plane.

Another disadvantage of the device of EP 0 987,601 A2 is that the number of photoelectrically generated electrons is dependent on the degree of cleanliness of the surface. Since mirror surfaces become contaminated to some extent with long operating times, a large change in output signals must be taken into consideration during operation. In addition, a plurality of light wavelengths generally strike the first mirror, in particular, which is provided with a multilayer coating, so that the measurement results are falsified as a result of the different spectral distributions.

The correction of the decentering of the first subsystem relative to the second subsystem by means of the collector has the disadvantage that, since the collector only makes possible a stigmatic imaging on a well-defined axis, the collector axis, a change of the collector position leads to aberrations. Further, the collector, which is connected, for example, to a cooling unit, comprises a mechanically large and heavy structural unit, which can be manipulated only in a complex manner.

SUMMARY OF THE INVENTION

The object of the invention is to provide an illumination system that avoids the above-described disadvantages, in particular, an illumination system, with which it is possible to exactly determine both an illumination A and the direction of light radiation in a plane. In particular, an illumination that is as uniform as possible and telecentering errors that are as small as possible in the field plane will be assured therewith.

In order to solve this object, it is necessary that
(a) the position of the light source or of an intermediate image of a light source is determined
(b) the direction of radiation at the site of the light source or in an intermediate image is determined
(c) the integral flux at the site of the source or at a site of an intermediate image is measured.

This object is solved by an illumination system that includes (a) a light source that emits light having a wavelength $\leq 193$ nm, where the light provides a predetermined illumination in a plane distant from the light source and defines a used area in the plane, and (b) a sensor, situated in or near the plane, for detecting light outside the used area.

The device according to the invention in a first embodiment is characterized in that at least one detector and one diaphragm are provided and the at least one detector is disposed in a plane, which is positioned at a distance to the light source in the light path from the light source to the field plane.

In the illumination systems in which in an preferred embodiment an intermediate image of the light source is formed, the detector is disposed preferably in a plane, which comes to lie at a distance from the intermediate image, in the light path from the light source to the field plane. The diaphragm is disposed preferably in the vicinity of or in the plane in which the intermediate image is formed.

If the position and intensity of the light source as well as its integral flux are not only to be determined, but also this information is employed to provide for an illumination that is as uniform as possible over time in the field plane, then the illumination system comprises a control and monitoring unit in an advantageous embodiment.

A relative flux measurement is made possible by means of at least one photosensitive detector in the light path that is distant from the light source, in particular, after the intermediate focal point. If more than one detector is used, then the sensitivity is improved, and the susceptibility to lateral intensity fluctuations in the light beam after the light source, in particular, after the intermediate image Z, is reduced.

The determination of direction and position of the light source or of an intermediate image Z of the light source can be solved in a particularly preferred arrangement by forcing the passage of the beam, in particular at the intermediate image or intermediate focal point, through a stationary diaphragm. A lateral misalignment is then detectable due to a decrease in the flux and is recognized by the above-named detector. The remaining directional information is obtained by a measurement of the light beam, i.e., of the light bundle, as it is formed behind the diaphragm. For this purpose, preferably two or more detectors are placed at inhomogeneities in intensity in the light bundle, for example, behind the intermediate focal point. The detectors are particularly preferably disposed at or in the vicinity of the edge of a predetermined illumination produced by the light bundle in a plane. Such an arrangement of the sensors has the advantage that a very sensitive detection can be made, if the actual illumination in the plane in which the detectors are disposed deviates from a pre-given illumination, i.e., the predetermined illumination, since in an arrangement at or in the vicinity of the edge of the predetermined illumination, the sensors are placed in the region where the intensity of the illumination increases and even small changes in the illumination, for example, by degradation of the light source or misalignment, can involve large changes in intensity.

In a preferred embodiment of the invention, it is provided to arrange the sensors on a supporting element. The supporting element is preferably part of the field facet mirror and, in addition to the sensors for a facetted illumination system, as disclosed in U.S. Pat. No. 6,438,199 B1, also supports the first raster elements, which are also denoted field facets in the case of reflective systems.

In a particularly preferred embodiment, it is provided that at least four sensors are disposed on a support substrate, of which, one of the four sensors is formed as a power detector and serves for determining the light power and thus serves as a dose monitor. In comparison to a dose monitor, in which a part of the light radiation is decoupled, an arrangement of such a power detector on a support substrate, on which the first raster elements are also disposed in a special configuration of the invention, has the advantage that the power, which is used directly for illumination in the field plane, is determined.

In a double facetted illumination system, as is described, for example, in WO 02/065482 or U.S. Pat. No. 6,438,199 B1, the first raster elements are preferably disposed on the first optical element, the so-called field mirror of raster elements, only in the region of the predetermined illumination A. It is particularly preferred, if the first raster elements, which are also denoted field facets, are arranged in such a way that each of the field facets is completely illuminated. Illuminated regions are then found on the support substrate, but these are not used for the illumination system, since no raster elements are disposed in this region. In a preferred embodiment of the invention, the sensors are disposed on the support element in the region or regions that is/are not used, in which a facet element is not installed on the support element.

In an enhanced embodiment of the invention, the position and direction of the light source are obtained by means of detectors, which are positioned at two different sites: a first detector or a first set of first detectors at a first site and at least one second detector or a second set of second detectors at a second site.

The first detector or the first set of detectors, as described above, is placed at some distance from the light source or from the intermediate image of the light source and detects the direction of the light beam traveling through the illumination system, i.e., the light bundle, for example, in two lateral coordinate directions. The description relative to FIG. 6 defines what is to be understood under the expression "distant from the light source". The distance thus designates the length of the light path from the light source or from the intermediate image of the light source to the detector. A second detector or a second set of second detectors is arranged at a greater distance from the light source or from an intermediate image of the light source than the first detector or the first set of detectors. The distance of the second detector or second set of detectors preferably amounts to more than 1.5 times the distance from the light source to the first detector or first set of detectors.

The second detector or second set of detectors also detects the lateral coordinate directions of the beam or the light bundle at the greater distance. By calculating the offset of the light cone at these two distances, the position of the focal point and direction can be determined. In the following derivation, it is assumed that the positions of a light bundle are determined, for example, via the center of mass of the light bundle or by means of well-defined rays in the planes $z=Z_1$ and $z=Z_2$, wherein the planes are aligned nearly perpendicular to the chief ray of the light bundle. Now, if the spatial position and direction of the light bundle deviates from the theoretical position and direction, then the deviating light angle a can be determined from the difference in the positional measurements $X_1$ and $X_2$ in planes $Z_1$ and $Z_2$ by means of $$\tan\alpha = \left|\frac{X_2 - X_1}{Z_2 - Z_1}\right|$$

Simultaneously, the beam offset $X_0$ in the plane $z=0$ can be determined as $$X_0 = |X_1 - Z_1 \tan\alpha|$$

Thus, position and direction of a light cone can be determined by means of two detectors disposed at a distance relative to one another in the direction of expansion of the light cone.

Alternatively, in a particularly preferred embodiment, the second detector, or the second set of detectors, is placed in a plane, in which an unused partial bundle of the light radiation from the light source or the intermediate image of the light source is imaged by means of supplemental focusing optics.

In this plane, the second detector or the second set of detectors is positioned for lateral positional measurements, e.g., the quadrant detector. The latter is capable of determining the relative deviation in position, for example, of the light source imaged therein. A particular feature of this arrangement is that the refocused image migrates laterally only in lateral positional changes of the light source or of the intermediate image of the light source, and then comes to lie laterally at another site on the detector, if additional optical components, such as, for example, a collector, is falsely aligned or its alignment state is modified due to thermal effects. A complete decoupling of position and direction of the light bundle can be achieved by means of this type of detector. In this way, for example, the alignment and active control of a misaligned system is essentially facilitated.

It is particularly preferred if the supplemental optics is designed as a multilayer coated mirror, which reflects only the used wavelength, e.g., 13.5 nm. In this way, the disruption of alignment by light of other wavelengths is prevented.

The detectors are preferably installed on optical elements or their supporting devices in order to obtain a stable reference between relative positional data relating to the optical elements. In a particularly preferred embodiment, the detectors are disposed in unutilized or so called unused areas of the illumination system. Unused areas or regions of the illumination system are regions of the illumination system, which are in fact illuminated by a light bundle which travels from the light source to the field plane of the illumination system, but are not utilized for the illumination of the field in the field plane. Such regions are formed, for example, in the vicinity of the first facetted element or field facet mirror with only completely illuminated field facets.

In the case of the predetermined illumination A in the plane, in which the first detector or the first set of detectors is disposed, this preferably involves an almost rotation-symmetric illumination, for example, an annular or elliptical illumination. In such a case with three sensors, which are disposed on the support element of the first component with raster elements, both a migration of the actual illumination, for example, based on the fact that the optical axis is misaligned, as well as a change in the size of the illuminated region, can be detected.

Radiation-sensitive semiconductor detectors, for example, of silicon, are preferably employed as the sensors. Likewise, temperature-sensitive detectors, for example, pyroelectric or bolometric detectors can be employed. These sensors provide high sensitivity and can be constructed in order to increase the spatial resolution of several elements. In a preferred embodiment, the illumination system is an illumination system which is divided into a first subsystem, which comprises the first optical elements, and images an object in an object plane, for example, a light source, into an intermediate image in a plane conjugated to the object plane, and into a second optical subsystem, which comprises the second optical elements and illuminates a field in a field plane.

The first optical subsystem is often described as the source-collector unit and the second optical subsystem is described as the principal illumination system.

In an illumination system with first and second subsystems, for example, disposed on the support element of the first optical component with first raster elements, i.e., the field facet mirror, with the at least one detector, a decentering of the first subsystem relative to the second subsystem can be detected and from the signals obtained, an alignment of the two subsystems relative to one another can then be carried out. The arrangement of the sensors according to the invention on the support substrate in the case of at least two sensors particularly permits both a determination of the actual beam position, as well as the beam direction of the first subsystem relative to the second subsystem. With this information, it is possible to align the first subsystem to the second subsystem.

In order to align the first subsystem relative to the second subsystem, it is advantageous if a mirror element with a positioning device is disposed in the first optical subsystem. The mirror element can preferably be a raster spectral filter, as described in US 2002-186,811 A1, the disclosure content of which is incorporated to the full extent in the present application. In an alternative embodiment, the raster spectral filter can be replaced by a planar mirror, or the source of the source-collector unit itself can be designed so that it can be moved by means of a positioning unit.

In a further embodiment the alignment of the first subsystem relative to the second subsystem can be achieved by using at least one additional light source emitting light in the visible wavelength region and at least one detector sensitive to the visible light. In a preferred embodiment the illumination system comprises at least three additional light sources emitting light in the visible wavelength region and three position detectors sensitive to the visible light. With three additional light sources and three position detectors six coordinates, i.e., three position coordinates and three angle coordinates, can be determined. With this information the first subsystem can be aligned relative to the second subsystem by using light of wavelengths different from the light of the EUV light source.

If light of the EUV light source is used then in a preferred embodiment of the invention three different partial light beams of EUV-radiation could be filtered out by using diaphragms for alignment purposes. In the light path from the EUV light source to, for example, a grating element situated in the first subsystem, the diaphragms are situated before the grating element. The three different partial light beams of EUV-radiation are detected by three different position detectors. With the three different partial light beams of EUV radiation and the three position detectors six coordinates, i.e., three position coordinates and three angle coordinates, could be determined. With this information it is possible that the first subsystem is aligned relative to the second subsystem by using only, or in addition to, the visible wavelengths EUV radiation for alignment purposes.

The illumination system preferably comprises a control and monitoring unit, wherein the control and monitoring unit is connected to at least one sensor on the support element as well as with a positioning device, for example, of the mirror element. The control and monitoring unit is preferably configured in such a way that, for example, the actual position and/or intensity of the illumination recorded by means of the sensors is compared with a predetermined position and/or intensity of the illumination and deviations therefrom can be determined. Based on these signals, the positioning device is then controlled for one optical element of the illumination system, preferably a mirror element, in particular, a grating spectral filter and the optical element, e.g., the mirror element is moved by rotation and displacement and oriented in such a way that the predetermined position and/or intensity of the illumination, for example, at the intermediate image or on the support element of the first optical element of an illumination system is obtained. By rotating and displacing the mirror element, the intermediate image of the light source is essentially moved and adjusted, and the beam direction is also aligned. Since a control of the mirror element is also possible during exposure, such a construction permits an alignment or adjustment of the two subsystems during the exposure process. If the adjusting system provides more than two adjusting axes, the position and direction of the light bundle can be adjusted independent of one another. For this purpose, for example, a mirror with two rotational and two translational axes is suitable, or also two mirrors, each with two rotational axes. A particularly preferred device for aligning the raster spectral filter is shown in U.S. Pat. No. 4,490,041, the disclosure content of which is incorporated to the full extent in the present application. In U.S. Pat. No. 4,490,041, the mounting device of a mirror element is described, which permits the reflected beam to change its direction while maintaining a fixed position on the mirror surface, by means of a rotation around a well-defined point of rotation, i.e., the point of incidence of a ray of a light bundle remains substantially constant when the mirror is rotated. If a device such as that described in U.S. Pat. No. 4,490,041, is employed as a positioning device, then the mirror element, in particular the raster spectral filter, can be moved and rotated by this positioning device in such a way that separate directional alignment and positional alignment are possible. For this purpose, the raster spectral filter can be mounted in a rotatable manner around the point of rotation described in U.S. Pat. No. 4,490,041, which defines an axis of rotation. An error in the direction of the light bundle, for example, in the region of the intermediate image, as it was determined by the above-described detectors, now can be corrected by rotating around this well-defined point of rotation, without losing the lateral position. A particularly simple alignment can be produced therewith.

In addition to the method for positioning the illumination, the invention also provides a method for controlling the intensity of the illumination in an illumination system. For this purpose, as described previously, for example, by means of the sensors disposed on the support element, the actual position and/or intensity of the illumination is recorded, this is evaluated in the evaluating unit and compared with a predetermined position and/or intensity of illumination and dependent on this, a positional device is controlled in order to adjust the actual position and/or intensity of illumination.

BRIEF DESCRIPTION OF THE DRAWINGS

The invention finds application, in particular, in an EUV projection exposure system for microlithography. The invention will be described below on the basis of examples of embodiment.

Here:

FIG. 1b shows an embodiment of an EUV projection exposure system configured as a first optical subsystem and a second optical subsystem, with additional light sources in the first optical subsystem;

FIGS. 2a to 2d show views in principle of alignment errors in an ETV illumination system divided into two optical subsystems;

FIG. 4 shows intensity distribution along section A-A in FIG. 3a;

FIG. 5 shows the top view onto a first optical element with first raster elements formed as a field facet mirror, with sensors disposed in the unused region; and FIG. 6 shows a side view of an alignment device for the raster spectral filter for mechanical decoupling of rotation and lateral alignment in the intermediate focal point.

DESCRIPTION OF THE INVENTION

Figure 1A:
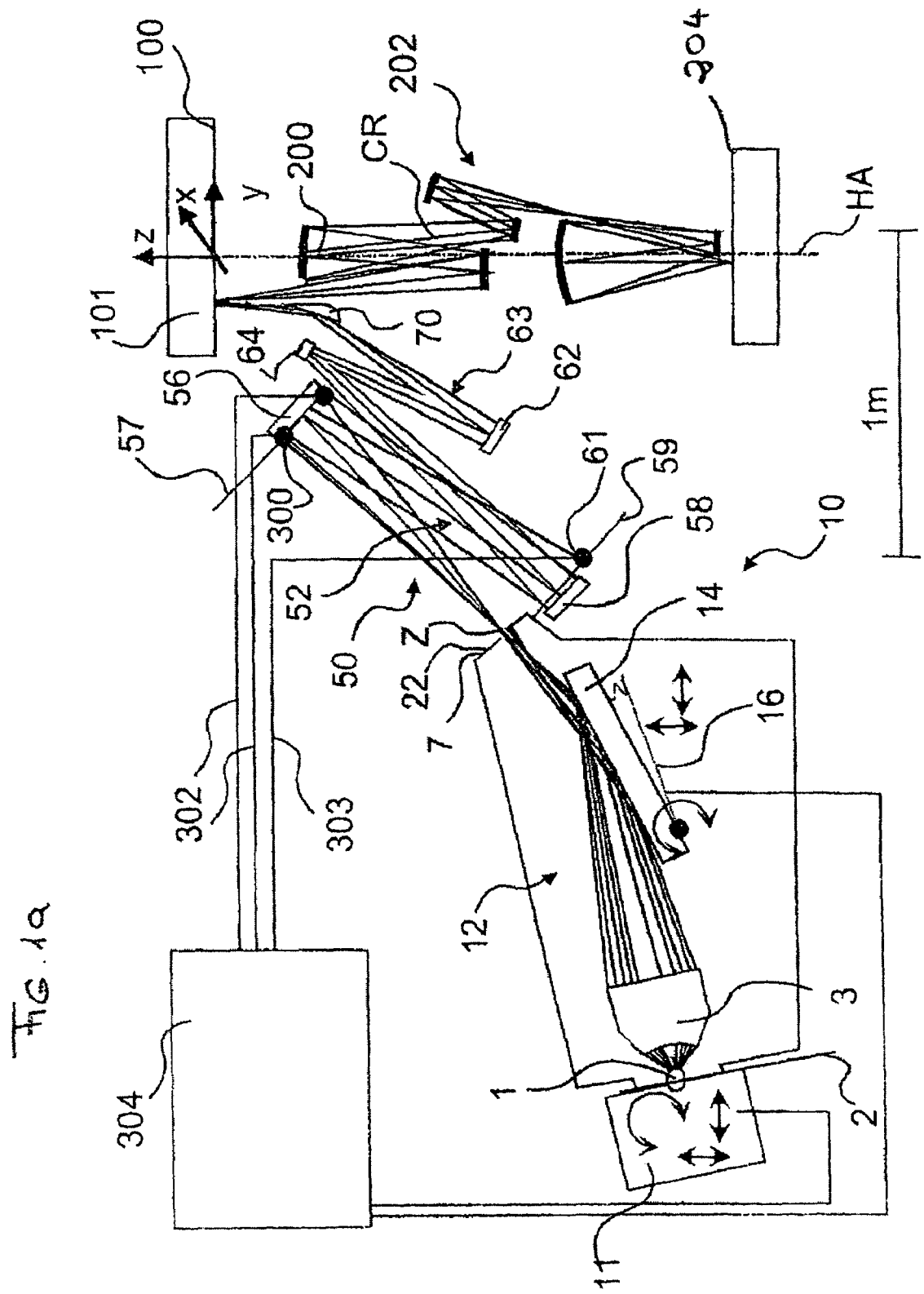
FIG. 1a shows an overall view of an EUV projection exposure system with a mirror element with a positioning device.

In FIG. 1a, an EUV projection exposure system is shown, in which sensors are disposed on a first optical element with first raster elements for detection of light striking a support element. The EUV projection exposure system comprises a light source 1 with a source plasma emitting EUV radiation, a collecting optical component, i.e., a so-called collector 3, which is formed as a nested collector according to WO 02/065482, the disclosure content of which is included to the full extent in the present application. The collector 3 images the light source 1 situated in an object plane 2 of an illumination system 10 into an intermediate image Z of the light source 1 or a secondary light source in a plane 7 conjugated to the object plane 2. A physical diaphragm 22 is disposed in or near the plane 7.

In the embodiment shown, the light source 1, which can be, for example, a laser-plasma source or a plasma discharge source, is disposed in the object plane 2 of the illumination system. The intermediate image Z of the primary light source 1 which is also denoted the secondary light source comes to lie in the plane 7 of the illumination system 10 conjugated to the object plane 2.

The optical subsystem from the light source 1 up to the intermediate image Z of the light source 1 is understood as the first optical subsystem 12 of the illumination system 10 in the present application.

The first subsystem 12, which is also denoted the source-collector unit, comprises in the embodiment shown, a grating element 14 and a positioning device 16 in addition to the collector 3 as the mirror element.

Such a grating element 14, which is also denoted a grating spectral filter, is shown, for example, in U.S. 2002-186,811 A1, the disclosure content of which is incorporated to the full extent in the present application. As is described in US 2002-186,811 A1, the focal point of the −1 order comes to lie in plane 7, in which the diaphragm 22 is disposed, i.e., the light source is imaged nearly stigmatically in the plane of the diaphragm by collector and raster element in the −1 diffraction order and a secondary light source or an intermediate image Z of the light source 1 results therein. All other diffraction orders, for example, the 0 diffraction order, are blocked by the diaphragm 22 for light of long wavelength, for example, DUV light.

In addition, the illumination system 10 of the projection system comprises a second optical system 50 for shaping and illuminating a field plane 100 with an annular field, as well as filling of the entrance pupil of the projection optics as centrally as possible, as described in U.S. Pat. No. 6,438,199 B1, the disclosure content of which is incorporated to the full extent in the present application. The local x,y,z-coordinate system is also depicted in the field plane 100. The second optical subsystem 50 comprises a first optical component 56 with first raster elements and a second optical component 58 with second raster elements, as a mixing unit 52 for homogeneous illumination of the field. The first and second raster elements are disposed on a first and a second support element. In this respect, reference is made to FIG. 5 for the first optical element. The first optical component 56 and the second optical component 58 with first or second raster elements in a reflective embodiment are also denoted the field facet mirror and the pupil facet mirror. Further, the second optical subsystem 50 comprises an imaging optics 63 with two imaging mirrors 62, 64 and a field-forming grazing-incidence mirror 70, in addition to mixing unit 52.

The first optical component, which is also denoted as a so called field facet mirror 56 generates a plurality of light-source images. As in the present case, if an intermediate image Z of the light source is formed, then the plurality of these light-source images are denoted tertiary light sources. The tertiary light sources lie in a plane 59, which is conjugated to plane 2 of the light source or to plane 7 of the intermediate image Z. The second optical component, which is also denoted as a so called pupil facet mirror 58 is disposed in or in the vicinity of this plane 59 in the case of a double facetted illumination system, as shown in FIG. 1. The pupil facet mirror comprises a support element onto a plurality of pupil facets are mounted.

At least one detector 61 is disposed on the support element of the pupil facet mirror or in the vicinity, for example, in plane 59, in one embodiment of the invention, for the detection of positional misalignments of the first and second subsystems 12, 50. This preferably involves a quadrant detector 650 as shown, for example, in FIGS. 3c and 3d.

Alternatively, in an another embodiment of the invention the radiation can also be deflected onto a separately disposed quadrant detector 650, which is arranged, for example, next to or distant from the pupil facet mirror. The quadrant detector 650 is, in turn, preferably disposed in a plane, in which a tertiary light-source image is formed.

In order to deflect the light onto the quadrant detector 650, for example, a decoupling mirror, as shown in FIG. 5, is disposed on the field facet mirror. Thus the angle of inclination and the radius of curvature of the decoupling mirror are selected in such a way that a light-source image is formed on the quadrant detector. The design of such a mirror lies in the domain of knowledge of the person skilled in the art.

The imaging optics 63 that follows in the light path from the light source 1 to the field plane 100 images the pupil facet mirror in the exit pupil of the illumination system, which comes to lie in the entrance pupil 200 of the projection objective 202. The entrance pupil 200 of the projection objective 202 is given by the point of intersection of a chief ray CR of a light bundle, which travels, for example, from the central field point (0,0) of the illuminated field in the field plane 100, with the principal optical axis HA of the projection objective 202.

The angles of inclination of the individual facets of the field facet mirror 56 and the pupil facet mirror 58 are designed such that the images of the individual field facets of the field facet mirror are superimposed in the field plane 100 of the illumination system and thus a largely homogenized illumination of the pattern-bearing mask 101, which comes to lie in this field plane, is made possible. The segment of the annular field is formed, for example, via the field-forming, grazing-incidence mirror 70 operating under grazing incidence. In an alternative embodiment, in a trivial manner, the field facets themselves may have the form of the field to be illuminated, thus can be shaped as annular segments.

The pattern-bearing mask 101, which is also denoted the reticle and is disposed in the field plane 100, is imaged by means of a projection objective 202 in the image plane 204 of the field plane 100. The projection objective is a 6-mirror projection objective, such as disclosed, for example, in U.S. Pat. No. 6,353,470, the disclosure content of which is incorporated to the full extent in the present application. The object to be exposed, for example, a wafer, is disposed in image plane 204 of the projection objective.

According to the invention, at least one sensor, which detects the actual illumination TA in a plane 57, is disposed in a plane, which is distant from the light source 1 or an intermediate image Z of the light source. Preferably the at least one sensor is disposed in the plane 57 in an area, which is defined by a predetermined illumination A, but is not utilized for the illumination of the field in the field plane 100 of the projection exposure system. It is particularly advantageous to dispose at least one sensor 300 on the support element of the field facet mirror 56 in one embodiment according to the invention. The sensors 300 detect the actual illumination TA on the support element of the first facet mirror 56. The first facet mirror is disposed in a plane 57 distant from the intermediate image Z of the light source, in which a predetermined illumination A will be provided. FIG. 5 shows a detailed view of sensors disposed on the support element. The signals of the sensors 300 are transmitted to an adjusting and control unit 304, for example, via an electrical connection 302. In the adjusting and control unit, the actual measured illumination TA is compared with the predetermined illumination A, for example, of an aligned system and as a function of the deviation determined, the raster element 14 is rotated around the depicted axis of rotation RA or is displaced along the depicted local y-axis, by means of the positioning device 16. In this manner, in an illumination system with intermediate image Z, the intermediate image Z can be shifted in its position and first and second subsystems can be aligned relative to one another in its direction, as described in FIGS. 3a-3b.

An embodiment of a positioning device 16 is shown in FIG. 6.

In an alternative embodiment, instead of the raster element 14, the position of the source plasma 1 can also be designed in a changeable manner, i.e., the source can be designed so that it can be moved by mechanical or electrical components of the source 11, which is particularly of advantage, if the source plasma 1 changes its site due to aging phenomena during operation. It is particularly preferred if several components are designed as components that can be manipulated, for example, source 11, raster element 14, or the entire source-collector unit 12.

In a further embodiment of the invention shown in FIG. 1b, a first optical subsystem comprises an additional light source, which emits radiation with wavelengths different to the EUV-wavelengths of an EUV light-source 3001. In the embodiment shown in FIG. 1b two additional light sources 3004.1, 3004.2 are shown. These light sources 3004.1, 3004.2 emit wavelengths preferably in the visible wavelength region. The additional light sources 3004.1, 3004.2 can be light emitting diodes (LED), lasers emitting in the visible wavelength region or light conducting fibers.

The EUV light source 3001 emits a main light bundle 3032 that travels through an illumination system 3099, only a portion of which is shown in FIG. 1b. Illumination system 3099 illuminates a field in a field plane (not shown in FIG. 1b). The main light bundle 3032 contains radiation of the used wavelengths, e.g., of 13.5 nm.

Each additional light source 3004.1, 3004.2 emits an additional light bundle containing radiation in the visible wavelength region. Only one additional light bundle 3034.1 associated to the additional light source 3004.1 is shown. The additional light bundles are used only for alignment purposes.

The light bundles of the additional light sources 3004.1, 3004.2 are deflected, for example, by an optical element 3014, preferably via a detector optic 3006.1, 3006.2 onto position detectors 3008.1, 3008.2, which are sensitive only to wavelengths emitted by additional light sources 3004.1, 3004.2. The detector optic 3006.1, 3006.2 is preferably an imaging optic. The position detectors 3008.1, 3008.2 are situated in a light path, after the first optical subsystem 3012, in a second optical subsystem 3050. In a most preferred embodiment the first optical subsystem 3012 comprises three additional light sources; two of them 3004.1, 3004.2 are shown in figure 1b. With a combination of three additional light sources and three position detectors it is possible to determine in total six coordinates, i.e., three position coordinates and three angle coordinates. With these six coordinates it is possible to align the first optical subsystem 3012 relative to the second optical subsystem 3050 without using light of the EUV light sources 3001.

In a most preferred embodiment, the alignment process is a two step process. In a first step, the first optical subsystem 3012 is coarsely aligned relative to the second optical subsystem 3050 by light of the additional light sources 3004.1, 3004.2 with a wavelength different from the used, e.g., EUV, wavelength. In a second step, light from the EUV light source 3001 is used for a finer alignment. For the second step, the light of the additional light sources 3004.1, 3004.2 is switched off and the light of the EUV light source 3001 is turned on. In the second step the first optical subsystem 3012 is aligned even better relative to the second optical subsystem 3050 by using light with a used wavelength, e.g. EUV light.

In some cases the alignment process can be accomplished in one step instead of two. In a one step process, the alignment is only performed by using light with a wavelength different from the used wavelengths. In an alternative embodiment of a one step process, the alignment can be performed by using only the light of the wavelength that is used for illumination purposes, e.g., EUV light.

When using EUV light for alignment purposes, preferably diaphragms 3017.1, 3017.2 are used, so that only a partial light bundle of EUV light for alignment purposes travels through the illumination system 3099 and the main light bundle 3032 of EUV light is blocked.

By using different diaphragms 3017.1, 3017.2 in the light path after the EUV light source 3001 and before position detectors 3013.1, 3013.2 that are sensitive to the EUV light, different partial light bundles of EUV light can be created for adjustment purposes. These partial light bundles are deflected by the optical element 3014, which is, in the embodiment shown, a grating element, via detector optic 3006.1, 3006.2 onto a position detector 3013.1, 3013.2. By using three different diaphragms, three different partial light bundles of EUV light for alignment purposes can be created. In FIG. 1b only one such partial light bundle 3015 of EUV light is shown. Furthermore, only two diaphragms 3017.1, 3017.2 are shown. The partial light bundle 3015 shown in FIG. 1b is associated to diaphragm 3017.1. In case three different partial light bundles are created, for example, by using three different diaphragms, in total six coordinates, i.e., three position coordinates and three angle coordinates, can be determined. With these six coordinates it is possible to align the first subsystem 3012 with regard to the second subsystem 3050 by using EUV light.

In the embodiment shown in FIG. 1b, the position detectors sensitive for the visible light 3008.1, 3008.2 are different in position to the EUV detectors 3013.1, 3013.2 sensitive for EUV radiation.

With the embodiment shown in FIG. 1b, an alignment of the first optical subsystem 3012 relative to the second optical subsystem 3050, only with EUV light, is possible. In an even more preferred embodiment, the diaphragms can be of such a shape, that only one position detector for the additional light sources and the partial light bundles of EUV light is necessary for detecting each position.

Advantageously, in an embodiment according to FIG. 1b, the first optical subsystem 3012 can be aligned with respect to the second optical subsystem 3050 without using a separate test device. The components for aligning the two optical subsystems 3012, 3050 are part of the system itself.

Figure 1C:
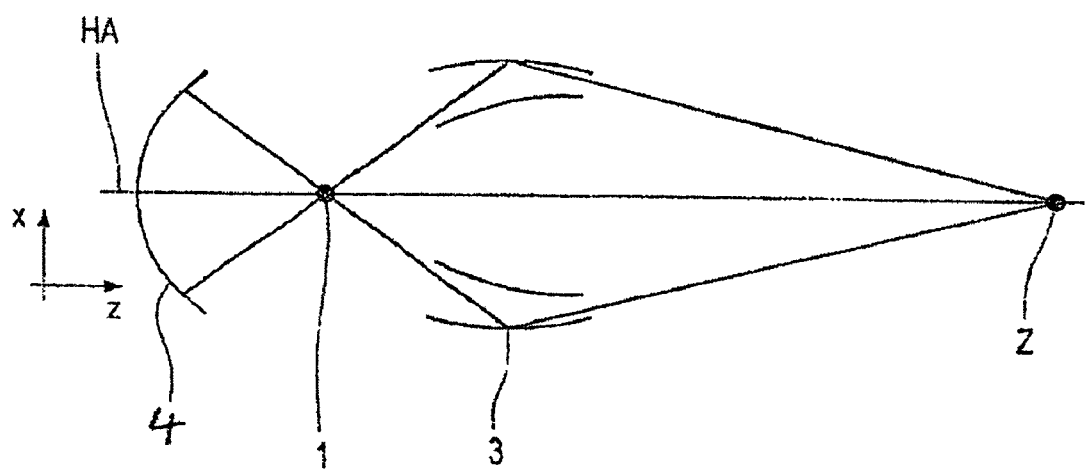
FIG. 1c shows an embodiment of an EUV projection exposure system with a double collector.

An excerpt of yet another embodiment of a projection exposure system from the light source up to the first intermediate focal point Z is shown in FIG. 1c. In addition to the nested collector, in the embodiment according to FIG. 1c, another collector 4 is provided, which is disposed in a half space behind light source 1. This collector absorbs the light emitted in the rear half space and refocuses it in or near the light source 1, so that an image of the light source 1 is formed in or near the light source 1 itself. Both the re-reflected light and the light focused into the image of the light source 1 as well as the light emitted by the light source 1 in the front half space are absorbed by the collector and imaged into an intermediate image Z in an intermediate image plane 7 (see FIG. 1) of the projection exposure system. In this manner, it is possible to increase the power of light source 1, which is provided in the projection exposure system, for example, by 1.5 times, in particular, in conjunction with a laser plasma source, which emits EUV light at 13.5 nm at a large solid angle in nearly all directions.

In a particularly advantageous embodiment of the invention shown in FIG. 1, at least one detector 61 is disposed in a plane 59, in which a light-source image, for example, a tertiary light source, is formed. A positional alignment of the system as described in FIGS. 3c-3e can be obtained by means of the signal, which is supplied by the detector 61. The signal, which is supplied by detector 61, is transmitted to the adjusting and control unit 304, which controls the positioning device 16, here the grating element 14.

In FIGS. 2a to 2d, possible misalignments of an illumination system are shown, in which an intermediate image Z of a primary light source of the illumination system is formed. The intermediate image Z divides the illumination system into a first subsystem 12 and a second subsystem 50. The first subsystem 12 is aligned relative to the second subsystem 50 in FIG. 2a. The optical axes 400.1, 400.2 of the first and second subsystems correspond, and the intermediate image Z of the light source comes to lie in a plane 7, which is conjugated to plane 2, in which the light source 1 of the illumination system is positioned. A physical diaphragm 22 preferably can be disposed in the plane 7, which is conjugated to the light-source image plane 2.

Three possible misalignments of the first and second subsystems 12, 50 of the illumination system are shown in FIGS. 2b to 2d.

A directional misalignment of the first and second subsystems 12, 50 is shown in FIG. 2b. Directional misalignment means that in fact, the plane 7, in which the intermediate image Z comes to lie, is congruent with plane 23 in which the physical diaphragm 22 is disposed; the optical axis 400.1 of the first subsystem, however, is inclined relative to the optical axis 400.2 of the second subsystem. By means of the at least one detector disposed at a distance from the intermediate image plane 7, it is possible to determine the tilt of the optical axis 400.1 of the first subsystem to the optical axis 400.2 of the second subsystem and to thus align the first optical axis 400.1 to the second optical axis 400.2, i.e., to align the system relative to the direction of the light. In the present application, "distance" is understood to mean the extent of the light from the intermediate image plane 7 up to the point of incidence on the detector. Care must be taken that the distance of the detector from the source or from the intermediate image of the source influences the resolution or measurement accuracy. The longer the distance selected, the higher the resolution will be. Typically, the resolution should be the range of less than 1 mrad. If the distance between detector and light source amounts to approximately 1 m, then an angle error of 1 mrad will lead to a lateral offset of the illumination of 1 mm. Thus, an angular resolution of essentially better than 1 mrad can be achieved with a detector of approximately 1 mm in size, at a distance of 1 m. The measurement accuracy in this case also depends on the gradient of the lateral distribution of illumination, in addition to the distance from the intermediate focal point, i.e., how much a detector signal changes in the case of a lateral offset of illumination. As explained in FIG. 4, the detector position is preferably selected in the region of the maximum gradient of the distribution of illumination, for example, at the edge of the illumination.

If it is stated in this application that the detector is disposed distant from the light source or from the intermediate image of the light, this means that the distance is usually selected such that in the case of a pre-specified detector size, a resolution of less than 1 mrad is achieved.

Preferably, the at least one detector disposed at a distance from the intermediate image plane 7 is positioned in a plane conjugated to the field plane 100 of the illumination system, in particular to the plane 57 of the illumination system, in which the first optical element with first raster elements, for example, the field facet mirror 56 in the case of reflective systems is disposed. A positioning of the at least one detector in the plane conjugated to the field plane outside the region that is utilized in an aligned system is preferably selected. "Utilized region" in this application is understood to mean that this region in the plane 57 contributes to the illumination of the field plane 100. For a field facet mirror, the utilized region in the sense of this application is the region which is illuminated with a predetermined illumination A and in which field facets are disposed, which absorb and reflect the light in the illuminated region, so that a field is illuminated in a field plane.

This is explained in more detail in the description for FIG. 5.

FIG. 2c shows the case of the lateral positional misalignment of the first and second subsystems 12, 50. In the case of a lateral positional misalignment, the intermediate image Z of the light source in fact comes to lie in the intermediate image plane 7, but does not strike this plane centrally to the optical axis 400.2 of the second optical system, in which the physical diaphragm 22 is disposed, i.e., the diaphragm blocks the passage of light into the second subsystem. This so-called lateral positional misalignment of the first and second subsystems 12, 50 can be detected by means of at least one detector, which is disposed in a plane 59, which is conjugated to the intermediate image plane 7 in the aligned system, and which recognizes the size and position of the resulting light spot.

FIG. 2d shows the case of the axial positional misalignment of the first and second subsystems. In the case of an axial positional misalignment, the intermediate image Z of the light source comes to lie in an intermediate image plane 7, which comes to lie, for example, in the light path from the light source to the field plane behind the diaphragm plane 23, in which the physical diaphragm 22 is disposed, i.e., intermediate image plane 7 and diaphragm plane 23 in this case are no longer congruent. This so-called positional misalignment of the first and second subsystems 12, 50 can be detected by means of at least one detector, which is disposed in a plane 59, which is conjugated to the intermediate image plane 7 in the aligned system. In the ideally aligned system, the light spot has a minimum expansion. With axial misalignment, the expansion of the light spot is increased and can thus be detected. For the detection of the axial positional misalignment, such a detector is preferably disposed in the plane of the illumination system, in which the second optical element with raster elements, for example, the pupil facet mirror 58 in the case of reflective double facetted systems is positioned.

If a system that is misaligned in both position and direction is aligned, then preferably a directional alignment will be conducted in the first step. The optical axis 400.1 of first subsystem 12 and the optical axis 400.2 of the second subsystem are then aligned relative to one another. In a subsequent second step, the position is aligned. After this, the process can be repeated until a desired alignment state is reached.

Figure 3A:
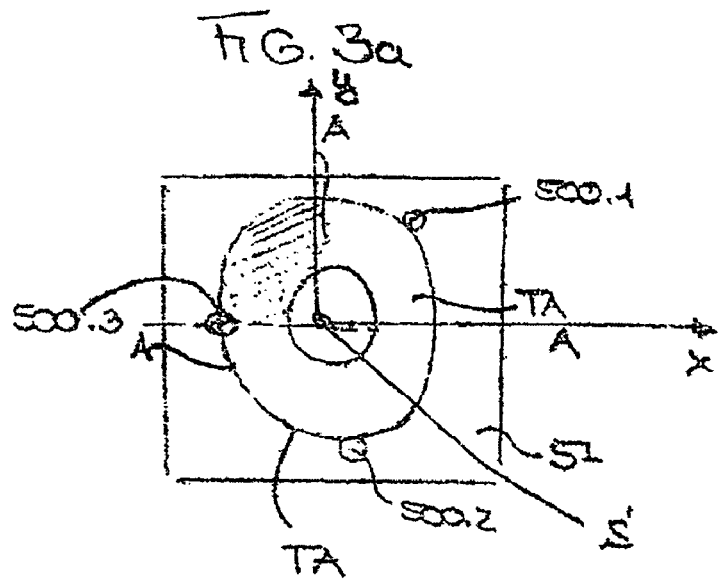
FIGS. 3a to 3b show illumination and arrangement of the sensor(s) in a plane, distant from the light source or an image of the source, for example, on a support plate of a first optical element with first raster elements as a function of alignment errors.
Figure 3B:
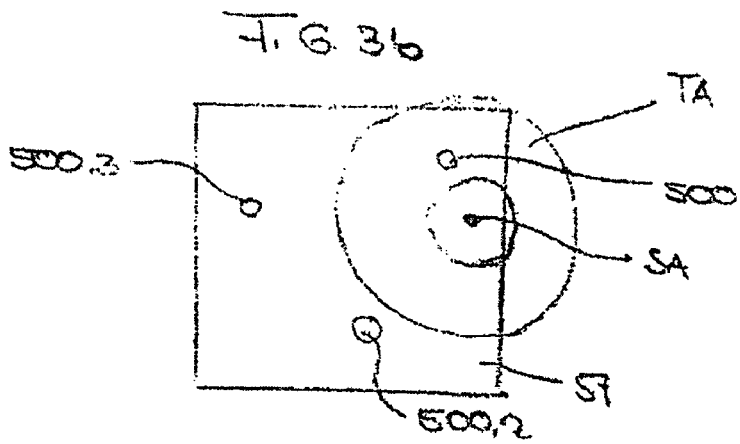

FIGS. 3a to 3b show the actual illuminations that result for the respective cases in FIGS. 2a to 2b in the plane in which the first detector or the first group of detectors is (are) disposed.

The illumination in the plane 57, in which at least one detector is positioned for the detection of misalignment in direction and which is disposed distant from the intermediate image Z, is shown for the case of an ideally aligned system in FIG. 3a. This preferably involves plane 57 as the plane, in which first optical element 56 with raster elements is disposed. The actual illumination TA corresponds to a predetermined illumination A in this plane. The predetermined illumination A is the illumination which is expected in this plane for an ideally aligned system. The illumination can be circular, slightly elliptical and/or annular, for example. As an example, an annular illumination is shown. A total of three detectors 500.1, 500.2, 500.3 are disposed distant from the intermediate image Z in plane 57, each at the edge of the annular, predetermined illumination A shown here by way of example. The field facet mirror 56 is preferably positioned in plane 57. The field facet mirror 56 comprises, for example, a support plate and a plurality of facetted mirrors, which are introduced on the support plate. A facet mirror with sensors disposed thereon is shown in detail in FIG. 5. It can be well recognized that the detectors or sensors 500.1, 500.2, 500.3 are disposed at the edge of the predetermined illumination A.

Now if a system is misaligned in direction, then the actual illumination TA in plane 57, in which the detectors are disposed, is laterally offset, as shown in FIG. 3b. As can be clearly recognized, the center of mass SA of the actual illumination TA as compared with the center of mass S of the predetermined illumination A, as it is represented in FIG. 3a, is shifted to the top right. This means that the sensor 500.1 detects more light intensity, while the sensors 500.2, 500.3 detect less light intensity. The is shown in greatly exaggerated form in FIG. 3b, in which case the detectors 500.2 and 500.3, in fact, would no longer detect any light intensity. In real systems, the intensity of illumination does not disappear abruptly, as shown in FIG. 4, but rather forms a continuous transition region of several mm in width. If the shift is smaller than this transition region, for example, three different intensities are measured with detectors 500.1 to 500.3.

From the intensity signals of the three sensors 500.1, 500.2, 500.3, the misalignment of the system can be determined in the evaluating unit and a positioning device 16, for example, actuators for rotating or moving a grating element 14, which acts as a spectral filter, can be controlled. Based on the signals determined by comparison of the actual illumination TA with the predetermined illumination A, the grating element 14 can be rotated and/or moved by means of positioning device 16 in such a way that the optical axis of the first subsystem is aligned to the optical axis of the second subsystem and the predetermined illumination A according to FIG. 3a is adjusted in plane 57 in which the field facet mirror is preferably disposed.

The detection unit designed according to the invention is in no way limited to three detectors. Thus, it is sufficient for a determination of the lateral shift, also if only 2 detectors are provided. For redundancy, i.e., security against the failure of individual detectors, however, it is particularly advantageous to introduce several detectors. This is particularly of advantage, since the projection exposure system with EUV radiation must be evacuated in operation, i.e., it is generally not accessible, and thus errors cannot simply be found and removed from outside the vacuum container.

Figure 3C:
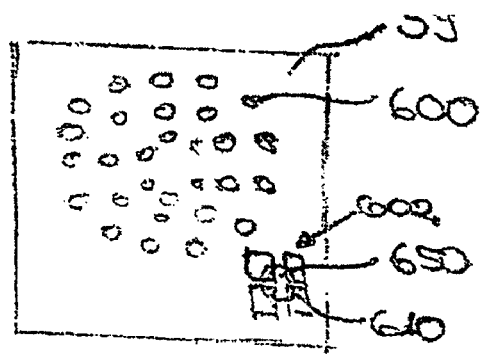
FIGS. 3c to 3g show illumination and arrangement of the sensor(s) in a plane, in which an image of the light source is formed.

FIG. 3c shows the illumination in a plane 59, in which, for example, a pupil facet mirror is placed, and which is conjugated to the intermediate image Z of the light source. A plurality of images 600 of light source 1, which are generated by the field facet mirror, are formed in plane 59. The number of these light-source images corresponds to the number of illuminated field facets. They are denoted by the reference number 600. According to the invention, for the detection of a misalignment of position, at least one detector 602 is disposed on the support element of the pupil facet mirror. The light is preferably deflected onto the detector 602 introduced onto the support element of the pupil facet mirror, by means of a refocusing optics, for example, a decoupling mirror disposed on the field facet mirror, as shown in FIG. 5. The size of the detector 602 is dimensioned in such a way that the light-source image, including possible misalignments, can fall on the detector surface, i.e., the lateral extension of the detector corresponds to the size of the light-source image plus twice the maximum detectable lateral misalignment, which is multiplied, if needed, by the imaging scale factor of the refocusing optics. If a lateral positional misalignment of first and second systems occurs, then, as shown in FIG. 2c, the intermediate image Z of the light source lies in plane 59 next to the axis, in which the physical diaphragm 22 is disposed. This leads to the circumstance that at the site at which detector 602 is disposed, for example, on the pupil facet mirror, the image of the light source produced by means of the refocusing optics is either no longer detectable, or if light still passes through the diaphragm 22, is shifted. The light spot then no longer falls centrally onto the detector, which is preferably designed as a quadrant detector 650. This has as a consequence that the asymmetry signal, which is supplied by the four detectors of the sensor, is different from zero in the case of a system misaligned in the lateral position. The lateral offset of the misalignment can thus be determined from the asymmetry signal and a signal can be derived in turn, with which the positioning device 16, for example, of the grating element 14 can be controlled.

In addition, the signals of all detectors can be summed up so that a relative signal over the integral radiation flux is provided.

It is particularly advantageous, if the light, which falls on the field facet mirror, is decoupled by means of a multilayer mirror. It is assured by coating the multilayer mirror, that only radiation of the used wavelength, for example, of 13.5 nm reaches one of the detectors. Since radiation of other wavelengths are also still being emitted from the light source, which also can originate from different volume regions of the source than from which the EUV radiation originates, it is possible to exactly determine the position of the source or of the intermediate image that emits the used wavelengths, e.g., 13.5 nm, with such an arrangement. An Si semiconductor detector is also sensitive to visible light, but this radiation arises in fewer hot regions of the plasma source and thus clearly at other positions. Without a filtering component, the alignment process using only EUV-radiation can be misguided and may be optimized to the apparent maximum, e.g., that of the visible light.

Figure 3D:
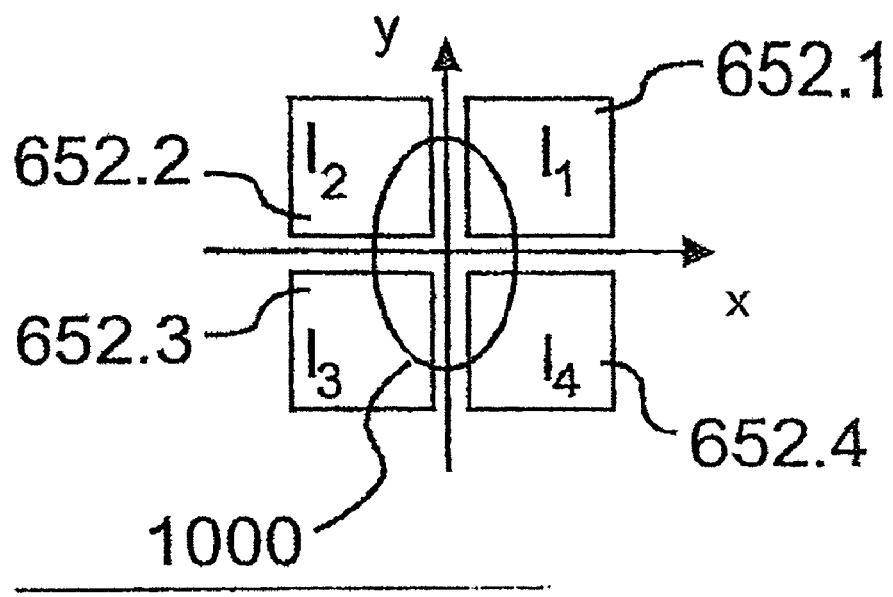

A quadrant detector, as is used for the measurement of the lateral positional misalignment, is shown in FIG. 3d. Depicted is the light spot 1000, which falls on the detector 602, which is designed as a quadrant detector 650. Four silicon detectors 652.1, 652.2, 652.3, 652.4 are found in the quadrant detector.

Also depicted is the local x,y coordinate system and the measured intensities $I_1$ to $I_4$ which are measured by the respective quadrant detectors and are further conducted to the control and monitoring unit. The asymmetry signals can be obtained from these measured $I_1$ to $I_4$ values:

$$A_1 = \frac{I_1 - I_3}{I_2 + I_4}$$

-continued $$A_2 = \frac{I_2 - I_4}{I_1 + I_3}$$

as well as the summed signals:

$$S_1 = I_1 + I_3$$
$$S_2 = I_2 + I_4$$

The lateral position of a misaligned system can be determined by this means, as described previously. Other evaluations are also possible, by which the position could be determined.

Figure 3E:
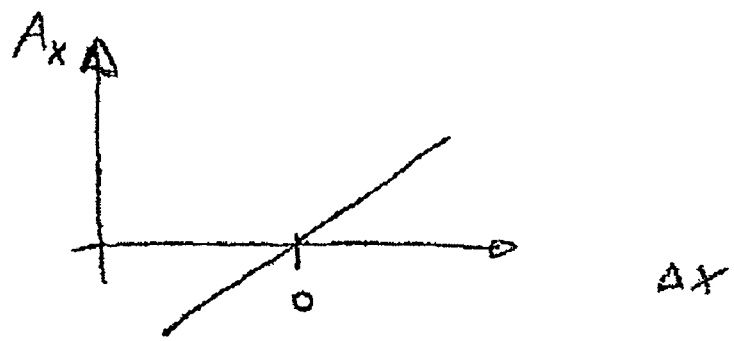

The course of the asymmetry signal $A_1$ as a function of the alignment in the diagonal direction $\Delta x$ is shown in FIG. 3e. An optimal alignment exists in the null passage.

Figure 3F:
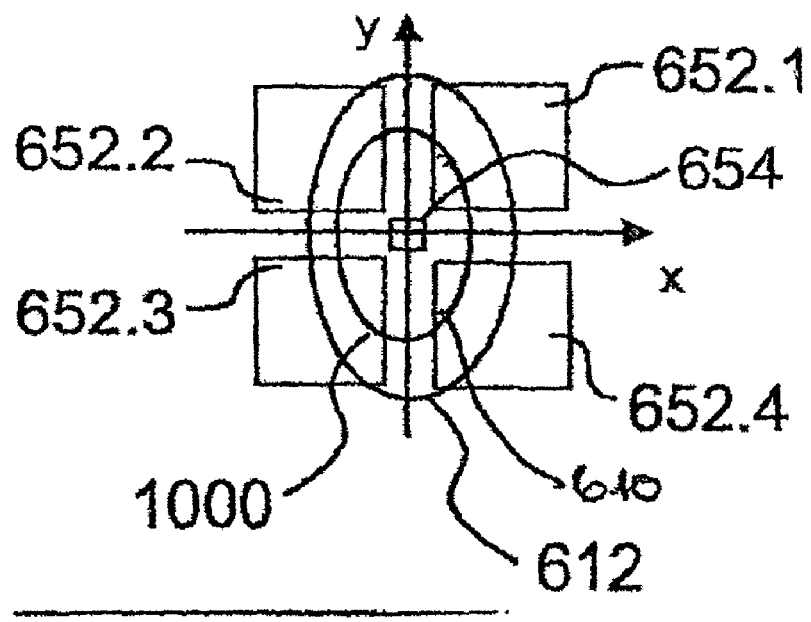

If an axial misalignment occurs, in contrast, as shown in FIG. 2d, the detector in plane 59 must detect either the irradiance or the extent of the refocused intermediate focal point. For this purpose, e.g., the quadrant detector must be modified as shown in FIG. 3f. In addition to the quadrant detectors 652.1, 652.2, 652.3, 652.4, an additional detector surface 654 is disposed in the center, which is preferably clearly smaller than the diameter of the refocused image 1000 in plane 59. The irradiation intensity or irradiance can thus be measured with the detector and an axial misalignment of the intermediate image can be recognized. The diameter of the defocused image of the light source is indicated by reference 612. If such an axial misalignment is present, then the irradiance I usually decreases in plane 59 and a corresponding correction signal can be sent to the evaluating unit or manipulator unit.

Figure 3G:
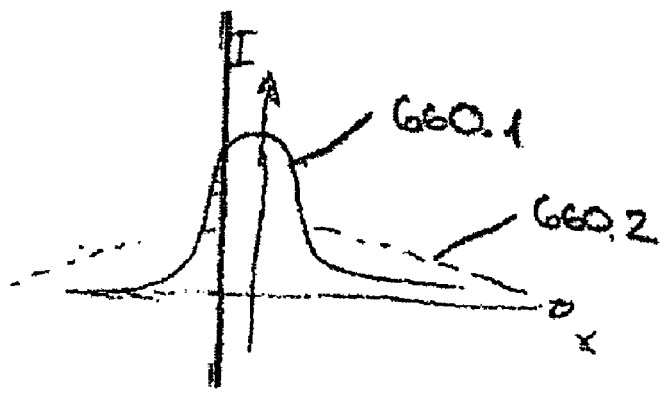

The course of the irradiance, as it is detected by detector 654, is shown in FIG. 3g. In a focused system, which produces a light-source image that is characterized in FIG. 3f by the reference number 610, this leads to an irradiance 660.1. If the system is axially aligned, then a light-source image 1000 in plane 59 is formed with minimum diameter, i.e., maximum intensity. The intensity of the irradiance in the case of a misaligned system, which is recorded by the detector, is characterized by the reference number 660.2.

An illumination system with detectors at sites that are disposed both distant from the intermediate image Z, for example, on the field facet mirror, and additionally in a plane, which is conjugated to the plane of the light source or of the intermediate image, is in fact advantageous, but in no way is it absolutely necessary for putting the invention into practice. Embodiments are also conceivable, in which detectors are only positioned distant from the intermediate image, for example, on the field facet mirror. An array of detectors can also be considered as detectors, for example a CCD camera, with which the light source can be observed directly in a plane 57. Such an arrangement is offered if an illumination system, for example, does not have an intermediate image of the source and the light source 1 can be positioned on the basis of the recorded signal and thus the illumination system can be aligned.

Of course, combinations of the misalignments of optical axis and position of the intermediate image, which are shown in FIGS. 2b and 2d, are possible. Such misalignments can also be detected with the system according to the invention and can be corrected by means of the positioning device, which appropriately positions the mirror element, presently the raster element, also during the exposure process.

A particularly sensitive detection is possible, if the sensors 500.1, 500.2, 500.3 are disposed on the support element of the field facet mirror at the edge of the predetermined illumination. As shown in FIG. 4 on the basis of the intensity curve along segment A-A, which runs in the direction of the x-axis according to FIG. 3a, the sensors 500.1, 500.2, 500.3 are preferably found in the region of the intensity increase, thus disposed at the edge of the illumination and therefore detect large differences in intensity when there are only small shifts of illumination. A particularly preferred site for the sensors is an arrangement at the site at which the half-maximum intensity value $I_{max}/2$ is reached.

The first optical component 56 according to FIG. 1 with first raster elements 150 is shown in FIG. 5. The first raster elements 150 are disposed in ten blocks 152.1, 152.2, 152.3, 152.4, 152.5, 152.6, 152.7, 152.8, 152.9, 152.10 that are spaced relative to one another.

In the region that is not illuminated due to the central shadow 154 of the collector 3, no raster elements 150 are disposed.

In a reflective embodiment of the invention, the first raster elements are facet mirrors. These may have, but should not have an optical effect. The first raster elements 150 are disposed on a support element 156. The arrangement of 122 first raster elements 150 on support element 156 can be clearly recognized. Also depicted is the predetermined annular, i.e., ring-shaped illumination A, which occurs in an aligned system. The annular illumination A is defined by an outer edge 162 and an inner edge 164. All first raster elements 150 lie within the predetermined annular illumination A and are completely illuminated. The illuminated regions on the support element, in which no first raster elements are disposed, are designated unutilized or unused regions 166 in the sense of this application, since the light striking these unused regions is not reflected by the raster elements and thus does not contribute to the illumination of the field plane.

A total of three sensors 500.1, 500.2, 500.3 are disposed in the vicinity of the outer edge 162 on the support element in the unutilized region 166. The position of illumination A on the support element of the field facet mirror is detected by these sensors 500.1, 500.2, 500.3. These data can be utilized for the control of the positioning device and for alignment of first and second subsystems, in particular, in the case of a directional alignment. The number of sensors can also be more than three. In addition, at least one decoupling mirror 170 is also disposed in the unutilized or unused region. By means of decoupling mirror 170, radiation that strikes the first optical element with first raster elements is decoupled and, for example, deflected on a four-quadrant detector, as described in FIGS. 3c to 3g. The four-quadrant detector is placed in a plane, in which an image of the light source, or of the intermediate image Z of the light source in the case of an aligned system, is formed. If a shift in the position of the intermediate image occurs, due to a positional misalignment of the first and second subsystems, then this can be detected with the four-quadrant detector, as described in FIGS. 3c to 3g, and positioning devices of the illumination system can be controlled correspondingly. As an example, a positioning device 16, which operates by means of the recorded signals for adjusting the position of the intermediate image Z of a light source according to the principles of U.S. Pat. No. 4,490,041, is shown in FIG. 6.

The positioning device comprises a mirror element, which can be formed as a grating element 14. The mirror element is connected at an angle mechanically to an axis of rotation 2000. By means of adjusting drive 2002, the mirror element rotates around the axis of rotation 2000.

Adjusting drive 2002 thus involves the adjusting drive for the rotation. The impinging light bundle 2006 is diffracted by the raster element and the collector unit into the −1 diffraction order and focused therein to form an intermediate image Z of the light source. Depicted also is diaphragm 22. When the adjusting drive is moved for the rotation, the position of the intermediate image Z always remains in the intermediate image plane. The adjusting drives 2010 are provided as the adjusting drive for translational movements. As described above and in U.S. Pat. No. 4,490,041, the translational movement can be decoupled from the rotational movement by the alignment device that is shown, for aligning the intermediate focal point.

An illumination system with which the alignment of an illumination system can be established and monitored in a simple way is provided for the first time by the invention. The latter assures the temporal and spatial constancy of the illumination of the mask and a central illumination of the pupil.

What is claimed is:

1. An illumination system, comprising:
    a light source that is situated in an object plane and emits light having a wavelength less than or equal to 193 nm, wherein the light provides a predetermined illumination in a plane distant from the light source and defines a used area in the plane that is distant from the light source;
    a first optical subsystem having first optical elements that images the light source into an intermediate image in an intermediate image plane conjugated to the object plane;
    a second optical subsystem having second optical elements, which illuminates a field in a field plane; and
    a sensor, situated in or near the plane that is distant from the light source, for detecting light outside the used area, and thus detecting a misalignment of said first subsystem and said second subsystem.

2. The illumination system of claim 1, further comprising:
    an optical element having raster elements, situated in or near the plane that is distant from the light source,
    wherein the raster elements generate a plurality of light source images of the light source, and
    wherein the sensor is situated on the optical element.

3. The illumination system of claim 2,
    wherein the optical element comprises a support element disposed in the plane that is distant from the light source, and
    wherein the raster elements are disposed on the support element within the predetermined illumination.

4. The illumination system of claim 3, wherein the disposition of the raster elements on the support element defines the used area.

5. The illumination system of claim 4, wherein the sensor is situated on the support element in a region in which none of the raster elements is disposed.

6. The illumination system of claim 1, further comprising an optical element having raster elements and a decoupling mirror having a multilayer coating, so that radiation of a used wavelength is decoupled and reaches the sensor.

7. The illumination system of claim 1, wherein the sensor is situated at or in a vicinity of an edge of the predetermined illumination.

8. The illumination system of claim 1, wherein the sensor is situated in a region of the predetermined illumination in which the predetermined illumination changes intensity.

9. The illumination system of claim 8, further comprising a diaphragm in or near the intermediate image plane.

10. An illumination system, comprising:
    a light source that emits light having a wavelength less than or equal to 193 nm, wherein the light provides a predetermined illumination in a plane distant from the light source and defines a used area in the plane that is distant form the light source;
    a first sensor, situated in or near the plane that is distant form the light source, for detecting light outside the used area,
    wherein the illumination system produces an image of the light source, or an image of an intermediate image of the light source, in an image plane, and
    wherein the illumination system further comprises a second sensor situated in or near the image plane.

11. The illumination system of claim 10, further comprising an optical component in or near the plane that is distant form the light source, wherein the optical component deflects light that impinges on the second sensor.

12. The illumination system of claim 10, further comprising:
    an optical element having raster elements, situated in or near the image plane,
    wherein the sensor is on the optical element.

13. The illumination system of claim 10, further comprising a quadrant detector situated in the image plane.

14. The illumination system of claim 1, wherein the predetermined illumination is an annular illumination.

15. The illumination system of claim 1, wherein the sensor comprises a photodetector.

16. The illumination system of claim 1, wherein the sensor comprises a detector selected from the group consisting of a radiation-sensitive semiconductor detector, and a thermally sensitive detector.

17. The illumination system of claim 1, further comprising a positioning device for positioning a component selected from the group consisting of a mirror element and the light source.

18. The illumination system of claim 17, wherein the mirror element is a grating spectral filter.

19. The illumination system of claim 1, further comprising an evaluating unit connected to the sensor.

20. The illumination system of claim 19, wherein the evaluating unit evaluates a signal from the sensor, and is connected to a positioning unit for positioning a component selected from the group consisting of a mirror and the light source.

21. The illumination system of claim 19, wherein the evaluating unit (a) determines a deviation between an actual illumination, indicated by the sensor, and the predetermined illumination, and (b) controls the positioning device to minimize the deviation.

22. The illumination system of claim 1,
    wherein the light source is a first light source and the wavelength is a first wavelength,
    wherein the illumination system further comprises a second light source that emits light having a second wavelength, and
    wherein the second wavelength is different from the first wavelength.

23. The illumination system of claim 22, wherein the second wavelength is in a visible wavelength region.

24. The illumination system of claim 1,
    wherein the light source is a first light source and the wavelength, and
    wherein the illumination system further comprises three additional lights sources, each of which emits light having a wavelength that is different from the first wavelength.

25. The illumination system of claim 22,
    wherein the sensor is a first sensor, and wherein the illumination system further comprises a second sensor for detecting the second wavelength.

26. The illumination system of claim 1, further comprising a diaphragm situated in a light path after the light source and before the plane that is distant form the light source.

27. A method comprising aligning the light of the illumination system of claim 1, wherein the aligning includes:
   detecting an actual illumination in the plane that is distant from the light source, as indicated by the sensor;
   comparing the actual illumination to the predetermined illumination; and
   controlling a path of the light to minimize a difference between the actual illumination and the predetermined illumination.

28. An EUV projection exposure system comprising:
   the illumination system of claim 1, for illuminating a mask in an image plane; and
   a projection objective for imaging the mask onto a light-sensitive object.

29. A method comprising employing the EUV projection exposure system of claim 28 to produce a microelectronic component.

* * * * *